(12) United States Patent
Bontinck et al.

(10) Patent No.: US 12,205,500 B2
(45) Date of Patent: Jan. 21, 2025

(54) DISPLAY TILE FOR TILED DISPLAY WITH IMPROVED FLATNESS

(71) Applicant: BARCO N.V., Kortrijk (BE)

(72) Inventors: Floris Albert Bontinck, Destelbergen (BE); Stephanie Cyriel Adrianna Van Haecke, Sint-Amandsberg (BE)

(73) Assignee: BARCO N.V., Kortrijk (BE)

(*) Notice: Subject to any disclaimer, the term of this patent is extended or adjusted under 35 U.S.C. 154(b) by 805 days.

(21) Appl. No.: 17/415,918

(22) PCT Filed: Dec. 21, 2018

(86) PCT No.: PCT/EP2018/086809
§ 371 (c)(1),
(2) Date: Jun. 18, 2021

(87) PCT Pub. No.: WO2020/126059
PCT Pub. Date: Jun. 25, 2020

(65) Prior Publication Data
US 2022/0084445 A1  Mar. 17, 2022

(51) Int. Cl.
*G09F 9/33* (2006.01)
*G09F 9/302* (2006.01)
*H10K 59/18* (2023.01)

(52) U.S. Cl.
CPC .............. *G09F 9/3026* (2013.01); *G09F 9/33* (2013.01); *H10K 59/18* (2023.02)

(58) Field of Classification Search
CPC ............ G09F 9/3026; G09F 9/33; G09F 9/35; H10K 59/18
See application file for complete search history.

(56) References Cited

U.S. PATENT DOCUMENTS

| | | | |
|---|---|---|---|
| 8,384,616 B2 | 2/2013 | Elliott et al. |
| 2007/0030436 A1 | 2/2007 | Sasabayashi |
| 2010/0090587 A1 | 4/2010 | Tsujimura |
| 2010/0090934 A1 | 4/2010 | Elliott et al. |

FOREIGN PATENT DOCUMENTS

| | | |
|---|---|---|
| JP | 2002062826 A | 2/2002 |
| JP | 2013061658 A | 4/2013 |
| WO | 2008091339 A2 | 7/2008 |
| WO | 2015189377 A1 | 12/2015 |

OTHER PUBLICATIONS

International Search Report and Written Opinion issued in PCT/EP2018/086809, dated Aug. 20, 2019.
Written Opinion issued in PCT/EP2018/086809, dated Nov. 19, 2020.
Office Action issued in Chinese Application No. 201880100418.6, dated Jan. 5, 2023, with English translation.

*Primary Examiner* — Cassandra Davis
(74) *Attorney, Agent, or Firm* — HSML P. C.

(57) ABSTRACT

A display tile includes a display board and a carrier board, the carrier board being for attachment to a frame or a bracket, the display board and the carrier board being fastened together by the intermediary of a spacer positioned between the display board and the carrier board. The spacer is glue or adhesive. The adhesive forms the spacer itself. The spacer can engage in an opening in the carrier board. The display board has image forming elements and the spacer is for setting a relative position of the tops of the image forming elements with respect to the carrier board.

18 Claims, 18 Drawing Sheets

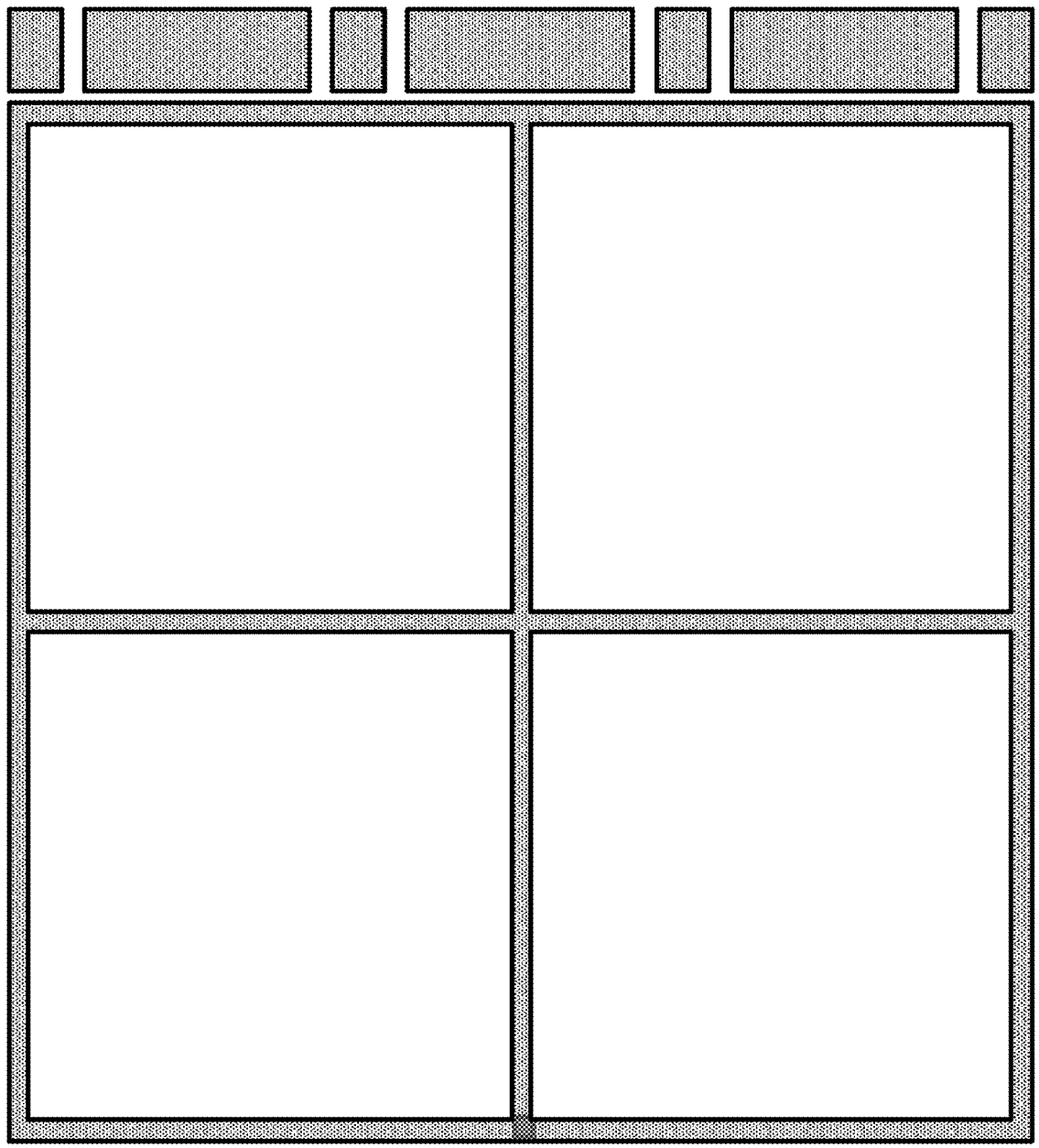
Fig 5
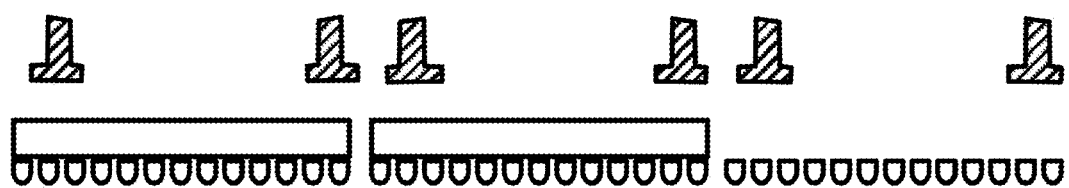

DISPLAY TILE FOR TILED DISPLAY WITH IMPROVED FLATNESS

The present invention relates to the field of display apparatus, and in particular to any of a display tile, a tiled display apparatus comprising same, an apparatus for setting the geometry of a display tile, a method for manufacturing a display tile and a tiled display, a method for setting the geometry of a display tile and a jig to facilitate the method for setting.

BACKGROUND

The regularity of the seam existing between display tiles in a tiled display is important to avoid visual artefacts. The regularity of the seam is a function of the alignment of the display tile. Techniques and apparatuses to align display tiles in tiled display are known in the art. For instance, U.S. Pat. No. 8,384,616 B2 "Isolating alignment and structural strength in LED display systems" describes how clips and receptacles are used to align adjacent display tiles with a high accuracy.

These and similar tile alignment techniques suppose that the LED themselves are properly aligned with the tile itself.

The LEDs are soldered to a LED board and the LED board is fastened to a carrier board. Aligning the LED board and the carrier board is usually done by means of one or more reference pin(s). The reference pin(s) is/are used to align the LED board with references (e.g. a corner) of the carrier board. Unfortunately, there are tolerances on the position of the LEDs with respect to the references of the LED board on which they are soldered ( ) and therefore, aligning the LED board perfectly with the carrier board by means of reference pins on the LED board does not mean that the LED themselves will be perfectly aligned with the carrier board. As a result, even if adjacent LED tiles are perfectly aligned, the relative position of the LEDs on different LED tiles may vary across a tiled display, thereby introducing visual artefacts.

Another problem not addressed by the clips and receptacles used in the prior art is the "z-coordinate" or position of the LED in a direction perpendicular to the plane of the LED board, e.g. to the plane of the display. Variation of the z position of the LED from tile to tile is the source of visual artefacts when the direction of a viewer's gaze is not along the normal to the plane of a tiled display.

Alignment of the LED themselves in a direction perpendicular to the plane of a LED board is described in WO2015189377 "ADJUSTABLE DISPLAY TILE FOR TILED DISPLAY".

A display tile according to WO2015189377 can be seen on FIG. 1 and comprises a display board (1) and a carrier board (3) fastened together by the intermediary of a spacer (7) and an adjusting means (6) positioned between the spacer and the carrier board. The adjusting means (6) engages in an opening (33) in the carrier board. The adjusting means is for adjusting the distance between the display board and the carrier board, e.g. between the tops of LEDs (2) on the display board (called the LED board) and the carrier board.

According to WO2015189377, an adjusting means 6 is positioned in an opening 33 in the carrier board and moved in the opening in a direction perpendicular to the board until a first surface of the adjusting means 6 contacts a spacer 7.

The position of the adjusting means in the opening is changed until the distance between a first surface (61) of the adjusting means and a first surface (31) of the carrier board is the difference between a nominal distance (D0) and the sum of the distance between the top of LEDs (2) on the LED board (1) and a second surface (12) of the LED board, the length of the spacer (7) and the thickness of the carrier board (3). In other words, the distance between a first surface (61) of the adjusting means (6) and a first surface (31) of the carrier board (3) is equal to:

D0—(distance between the top of the LEDs and a second surface of the LED board)–(length of the spacer)–(thickness of the carrier board). The nominal distance D0 is the desired distance between the top of the LEDs 2 and the second surface (32) or back of the carrier board (3).

The adjusting means 6 is then fastened to the spacer 7 e.g. by means of a screw 8. This operation is repeated for every spacer 7, 7b . . . that can be accessed by an opening 33, 33b . . . in the carrier board by means of adjusting means 6, 6b . . . and screws 8, 8b . . . .

Once that has been done, the adjusting means 6 is fastened to the carrier board itself. This can be done by dispensing glue 9 in the opening 33 of the carrier board. The operation is repeated for each spacer on the LED board 1 facing an opening in the carrier board 3.

The solution described in WO2015189377 has allowed unparalleled alignment between adjacent tiles in a direction perpendicular to the tiles but it is not easily automated and it does not lend itself easily to mass production.

What is needed is an even easier solution to adjust the distance between the top of the LEDs on the LED board and a reference, e.g. the back surface of the carrier board. That solution must also be easily automated.

The art needs further improvement.

SUMMARY OF THE INVENTION

An object of embodiments of the present invention is to provide any of a display tile, a tiled display apparatus comprising same, an apparatus for setting the geometry of a display tile, a method for manufacturing a display tile and a tiled display, a method setting the geometry of a display tile and a jig to facilitate the method for setting.

An advantage of embodiments of the present invention is that the process can be automated, e.g. using pick and place robots. The processes of embodiments of the present invention involve relatively simple translation horizontally or vertically and these processes can be provided with jigs (such as reference and plates) to control the operations.

Embodiments of the present invention provide a display tile comprising a display board and a carrier board. The carrier board can be for attachment to a frame or a bracket (e.g. bracket connecting the carrier board of two neighbouring tiles). The display board and the carrier board can be fastened together by the intermediary of a spacer positioned between the display board and the carrier board. The spacer can be glue or adhesive which forms the spacer itself. The spacer can engage in an opening in the carrier board. The display board (1) has image forming elements (5) and the spacer (4) is for setting a relative position of the tops of the image forming elements (5) with respect to the carrier board (2).

In one aspect embodiment of the present invention provide a display tile comprising a display board (1) and a carrier board (2), the display board (1) and the carrier board (2) being fastened together by the intermediary of a spacer (4) wherein the spacer (4) is at least located between the carrier board (2) and the display board (1) on either side of an opening (3) in the carrier board (2), the spacer (4) being for setting a relative position of the display board (1) with respect to the carrier board (2), the spacer (4) comprising an adhesive. The spacer is located in the opening and extends laterally between the carrier board and the display board. Using an adhesive to set a dimension is useful as the adhesive adapts itself to differences in distance automatically when inserted.

Preferably the spacer consists essentially of adhesive. This is useful as it means that the injection of adhesive is all that is needed.

The opening (3) has sidewalls (31) and the spacer (4) comprises a pillar or bolt like section (41) and occupies a part of the opening (3) and is delimited laterally by the sidewalls (31) of the opening (3). This indicates that the adhesive fills up the space available not requiring additional steps or materials.

The display board (1) can have image forming elements (5) and the spacer (4) is for setting a relative position of the tops of the image forming elements (5) with respect to the carrier board (2).

The spacer (4) extends across and fills a cross-section of the opening (3).

The carrier board (2) has a first major surface (21) and a second major surface (22) remote from the display board (1) and the sidewall (31) of the opening (3) in the carrier board (2) is perpendicular to the second major surface (22) of the carrier board (2).

The carrier board can be adapted to be connected to a frame or bracket.

The adhesive sets the relative position of the display board (1) with respect to the carrier board (3).

Using adhesive to space and fix the carrier board to the display boards means that the adhesive in combination with the use of an offset plate can absorb varying thicknesses of the display boards. Despite such variation, the offset plate sets a distance relevant to the differences in the out of plane Z direction between display boards. This difference in the Z direction can be held to below 3% of the pixel pitch in embodiments of the present invention, e.g. less than 24 micron for display boards such as OLED or LED boards with a pixel pitch of 24 micron.

In another aspect the present invention provides a display comprising display tiles described above.

This display can be flat or curved.

Embodiments of the present invention provide a method of fixing a carrier board (2) to one or more display boards (1) having image forming elements (5), the carrier board (2) having at least one opening (3) per display board, the method comprising:

positioning the display boards (1) next to each other on a first reference plate (8), placing an offset frame (9) so that it surrounds the display boards (1); positioning one or more carrier boards (2) above the display boards (1), the carrier boards (2) having a first major surface (21) and a second major surface (22) remote from the display boards (1) wherein the offset frame (9) determines the distance from the first major surface (21) of the carrier board (2) and a plane containing the tops of the image forming elements (5), or the offset frame (9) determines the distance (D0) between the second surface (22) of the carrier board (1) and the plane containing the top of the image forming elements (5), applying an adhesive (90) on discreet spots through one or more openings (3) in the carrier board (2) to locate the adhesive between the carrier board (2) and the display board (1) on either side of the one or more openings (3) in the carrier board (2).

In the method the adhesive can be applied in a bolus (93) of adhesive injected or dispensed through the one or more openings (3) in the carrier board (2).

The display boards (1), the carrier board (2), the first reference plate (8), and the offset frame (9) are preferably held in place during solidification or curing of the adhesive.

The opening (3) has sidewalls (31) and the solidified adhesive comprises a pillar or bolt like section (41) and occupies a part of the opening (3) and is delimited laterally by the sidewalls (31) of the opening (3).

The display board (1) preferably has image forming elements (5) and the solidified adhesive sets a relative position of the tops of the image forming elements (5) with respect to the carrier board (2).

The adhesive preferably extends across and fills a cross-section of the opening (3).

The carrier board (2) can have a first major surfaces (21) and a second major surface (22) remote from the display board (1) and the sidewall (31) of the opening (3) in the carrier board (2) is perpendicular to the second major surface (22) of the carrier board (2).

Embodiments provide a tiled display apparatus comprising a plurality of display tiles as described above fixed to a frame.

Embodiments of the present invention provide a method to set the distance between the tops of LEDs (2) on a first surface of a LED board (1) on a display tile and the back surface (32) of the carrier board (3) of the display tile, the method comprising the steps:

positioning the tops of the LEDs (2) on a LED board (1) in a first reference plane (101), aligning openings (33, 33b . . . ) in the carrier board with spacers (7, 7b . . . ) distributed on the LED board (1), positioning a second surface of a carrier board (3) in a second reference plane (104), a first surface (11) of the carrier board facing a second surface of the LED board (1); the first and second reference planes being parallel and the distance between the first and second reference planes being equal to a nominal distance (D0), applying an adhesive in the openings (33, 33b) through one or more openings (3) in the carrier board (2) to locate the adhesive between the carrier board (2) and the display board (1) on either side of the one or more openings (3) in the carrier board (2).

The adhesive can be applied in a bolus (93) of adhesive injected or dispensed through the one or more openings (3) in the carrier board (2).

The opening (3) has sidewalls (31) and the adhesive when solidified comprises a pillar or bolt like section (41) and occupies a part of the opening (3) and is delimited laterally by the sidewalls (31) of the opening (3).

The display board (1) can have image forming elements (5) and the adhesive when solidified sets a relative position of the tops of the image forming elements (5) with respect to the carrier board (2).

The adhesive preferably extends across and fills a cross-section of the opening (3).

The carrier board (2) preferably has a first major surfaces (21) and a second major surface (22) remote from the display board (1) and the sidewall (31) of the opening (3) in the carrier board (2) is perpendicular to the second major surface (22) of the carrier board (2).

It is an advantage of the present invention that setting the relative position of discrete solid state image forming elements such as LEDs or OLEDs on a board with image forming element such as a Display board or an OLED board with respect to a carrier board will improve the alignment of tiles in tiled displays. Another advantage is that the seam between tiles can be made as regular as possible, thereby avoiding the introduction of misalignments and their associated visual artefacts. These advantages can each or both be achieved without having to machine components specific to a board with image forming elements such as an LED or OLED board in function of the distance between image forming elements such as the LEDs and the LED board or the OLEDs and the OLED board.

Using adhesive to space and fix the carrier board to the display boards means that the adhesive in combination with the use of an offset plate can absorb varying thicknesses of the display boards. Despite such variation, the offset plate sets a distance relevant to the differences in the out of plane Z direction between display boards. This difference in the Z direction can be held to below 3% of the pixel pitch in embodiments of the present invention, e.g. less than 24 micron for display boards such as OLED or LED boards with a pixel pitch of 24 micron.

Embodiments of the present invention apply to flat or curved displays. The process as described can be identical for both flat and curved displays. A curved display produced by this method will be semi-segmented, meaning that the transitions between display elements will be flat as they are partially supported at the edges of the display element. For curved displays the center part of the display elements are bent but only after the bonding of the elements themselves in a flat state. The backbone of a curved display comprises multiple strips (e.g. bonded to the display element) mounted onto a second structure which can be, but is not necessarily curved by itself. Other shapes of display are included within the scope of the present invention as can be constructed from display element which can be deformed or bent after the bonding of the elements themselves in a flat state.

BRIEF DESCRIPTION OF THE FIGURES

FIG. 5 shows a cross section of a reference board with LED boards and offset frame.

ACRONYMS AND DEFINITIONS

Cylinder. Cylinders can be solid or hollow. As used in the present invention, a stud (see below) has a part which is a solid cylinder.

Figure 11:
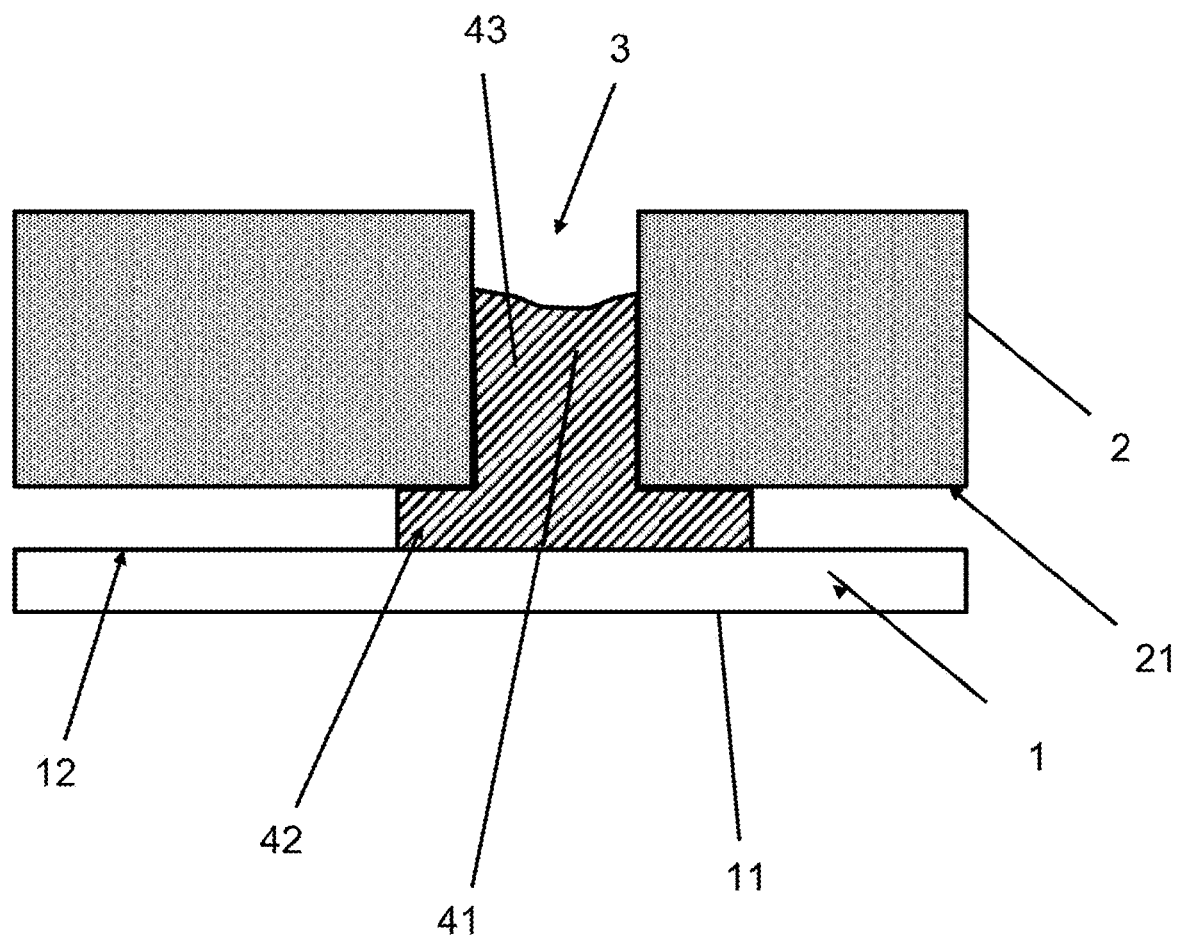
FIG. 11 shows a stud according to an embodiment of the present invention.

Stud. A stud is usually defined in mechanical engineering as a large-headed nail or other projection protruding from a surface, in particular or a headless bolt that is threaded at both ends and unthreaded in a center portion. In the present patent application stud will be used for an entirely unthreaded cylinder shaped mechanical element that can be threaded in its entirety, partially or not at all. The mechanical element can have a head or be headless. An example of stud for use in any of the embodiments of the present invention is given on FIG. 11. The stud 4 has a central pillar 41 that is delimited by the sides of the opening 3 in the carrier board 2. The base 43 of the pillar 41 is not necessarily flat but it can be irregular, the deviation from flatness being brought about by e.g. shrinking of the material of the pillar.

The central pillar 41 reaches the second surface 12 of the printed circuit board 1 and depending on the nature of the material of the pillar; it can extend laterally in the space between the second surface 12 of the board 1 and the first surface 21 of the carrier board 2. In that case, the stud 4 has a T-shaped cross section with shims 42 as illustrated on FIG. 11 around the pillar.

Thixotropic. A thixotropic adhesive is solid under normal conditions, but flows (becomes thin, less viscous) over time when stressed, e.g. by shear forces, in particular when pressed through the opening.

Adhesive. Also known as glue, cement, mucilage, or paste, is any substance applied to one surface, or both surfaces, of two separate items that binds them together and resists their separation. Adhesives are typically described by reference to the method of adhesion. These are then organized into reactive and non-reactive adhesives. Reactive adhesives cure in order to harden. Reactive adhesives can be one shot or multiple shot adhesives (e.g. separate matrix and hardener).

Adhesives may be found naturally or produced synthetically. Adhesives for use with embodiments of the present are preferably capable of injection. They can be, thermosets or thermoplastics, for example. Thermosets can be better adapted to provide structural adhesives. Material that are mechanically more stable over time than other adhesive systems is preferred.

"Image forming elements" can be discrete solid state light emitters or transmitters such as LEDs or OLEDs or diode lasers or quantum dots. Or they can be LCD emitters, for example.

"Display board" means a board on which an image forming element or image forming elements are located. These elements are driven to create an image, either static or dynamic (video). In the following the display board will be called an "LED board". (2) LED board i.o. Display board: Several LED boards or OLED boards can be positioned next to each other to form a display board. Several display board can be tiled together to form a larger tiled display. A small LED board which is an atomic element, i.e. indivisible, can be called a "stamp".

DESCRIPTION OF EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

While the description will be done for a LED display, the invention also applies to display tile where an image forming element (e.g. a liquid crystal panel) or a set of image forming elements (e.g. solid state light sources, LED or OLED) on a display board must be aligned with a carrier board. In the following any reference to LED (light emitting diode) can be replaced with OLED (organic light emitting diode) or with any suitable image forming element such as a solid state light source. In the following a display board will be described with reference to an LED display, and hence the display board will be called LED board, as an example. However, the display board is not limited to an LED board but includes other types of boards such as display boards with OLED emitters (i.e. OLED boards) as well as other emissive display elements or image forming elements in general.

Figure 1:
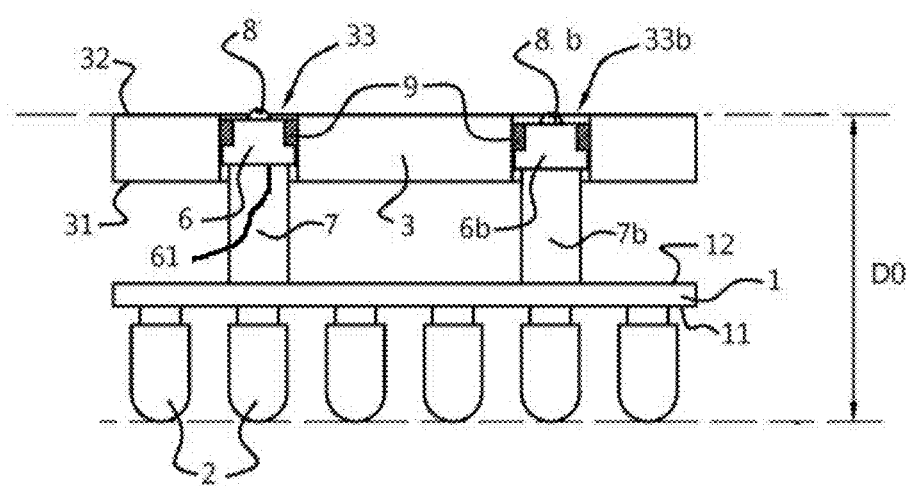
FIG. 1 shows a solution known to the art to adjust the geometry of a display tile.
Figure 2:
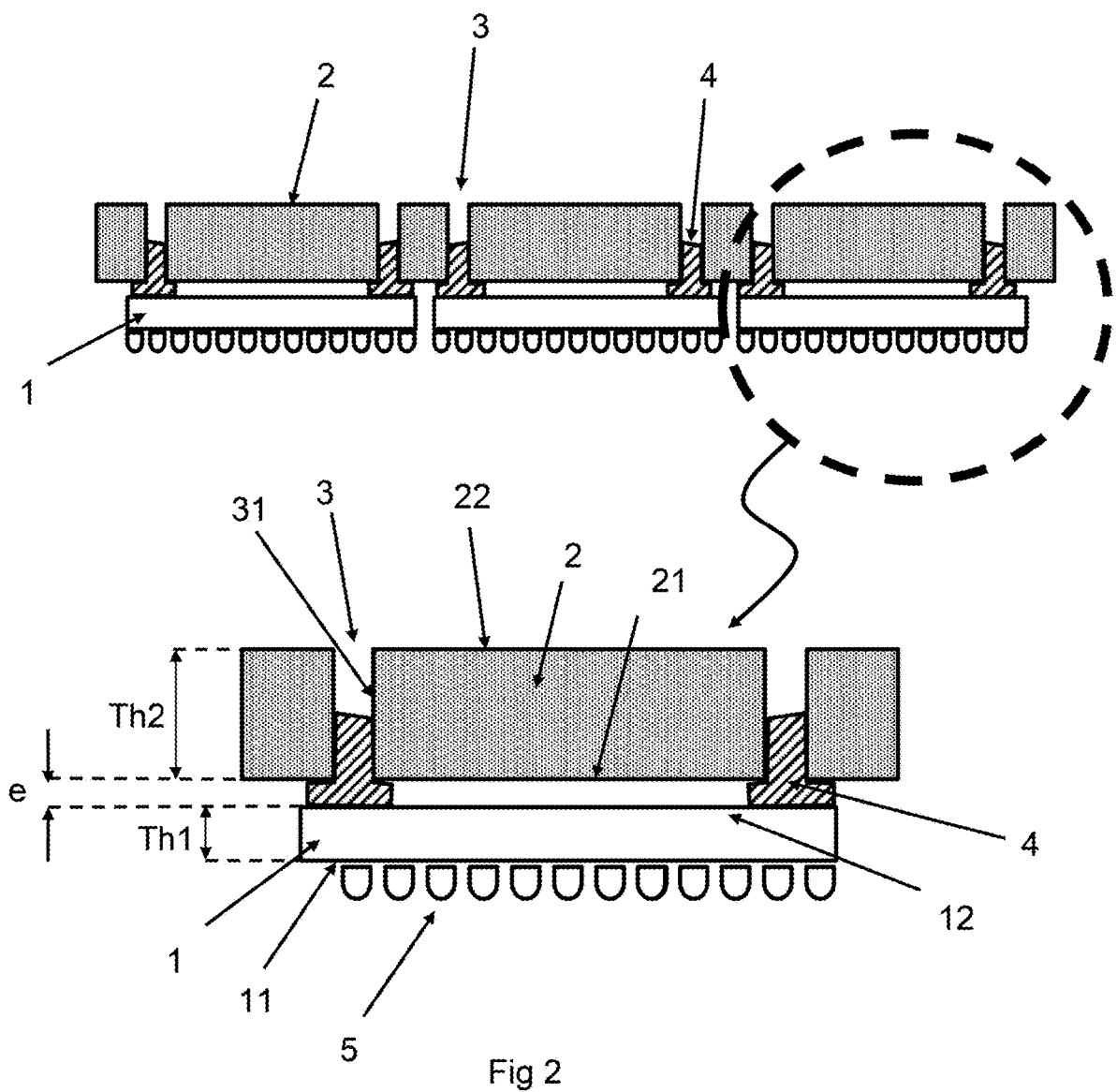
FIG. 2 shows how a display tile and a carrier board are fastened according to an embodiment of the present invention.
Figure 12:
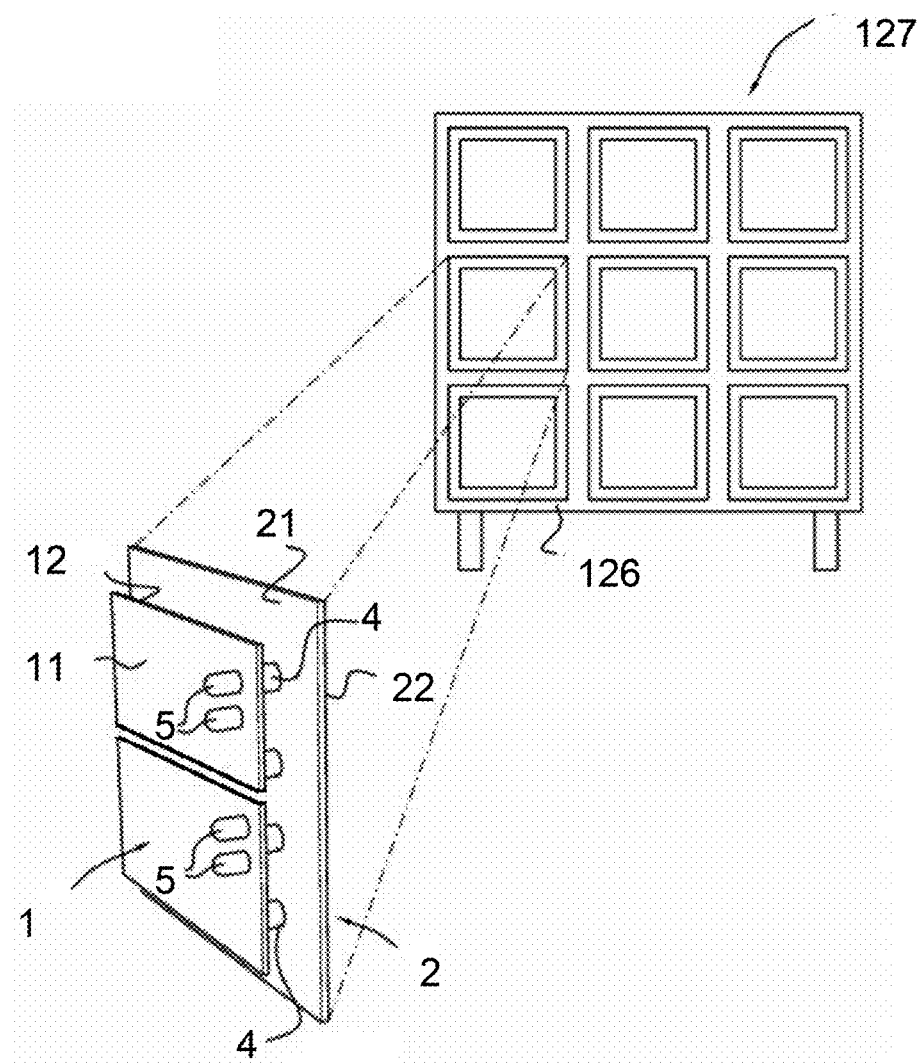
FIG. 12 shows a support structure of a tiled display in accordance with an embodiment of the present invention.

Referring to FIG. 2, a display board with image forming elements such as LEDs or OLEDS will be called a LED board 1. LED board 1 comprises or consists of a printed circuit board (PCB) bearing electrically conducting tracks e.g. copper tracks that connect Image forming elements such as Light Emitting Diodes 5 (LED or OLED) to various electronic components (like e.g. current drivers, power supply contacts etc. . . . ). As seen on FIG. 2, The LED board 1 has a first surface 11 and a second surface 12 that are parallel to each other. The distance between the first surface 11 and the second surface 12 is the thickness Th1 of the LED board 1. The image forming elements such as LEDs 5 or OLEDs are mounted on the first surface 11 of the LED board. The tolerance on the vertical position of the LED 5 with respect to the first surface 11 is the same for all LEDs mounted on the same LED board 1. The LEDs can be surface mount devices or through-hole devices. The LED board 1 is fastened to a carrier board or backbone 2. The carrier board 2 will be the mechanical interface between the LED board and a support structure 126 of a tiled display 127 as shown in FIG. 12.

The carrier board 2 has a first surface 21 and a second surface 22. The first surface 21 and the second surface 22 are substantially parallel to each other. The distance between the first surface 21 and the second surface 22 is the thickness Th2 of the carrier board 2. The first surface 21 (i.e. the front or front surface of the carrier board 2) will be closest to the LED board 1 when the LED board 1 and the carrier board 2 are assembled. The second surface 22 (i.e. the back or back surface of the carrier board 2) will be closest to the support structure 126 when the LED board 1 and its associated carrier board 2 are fastened to the support structure 126.

The carrier board 2 has at least one opening 3 extending from the first surface 21 to the second surface 22. The opening 3 has sidewalls 31 that are preferably perpendicular to the first surface 21 and the second surface 22 of the carrier board 2. The intersection of the sidewalls 31 with the first surface 21 and the second surface is a curve C1. C1 is preferably a circle but other curves are possible (including but not limited to a square, an ellipse . . . )

An adhesive can be injected or dispensed between the second surface 12 of the LED board 1 and the first surface 21 of the carrier board 2 through an opening 3. When cured, the adhesive form a stud 4. The stud 4 will typically have a pillar or bolt like section 41 as seen on FIG. 2 and FIG. 11. The pillar occupies the opening 3 and is delimited laterally by the sidewalls of the opening 3. When dispensed, the adhesive will also spread laterally between the second surface 12 of the LED board and the first surface 21 of the carrier board. Lateral expansion between the second surface 12 of the LED board and the first surface 21 of the carrier board can be limited for instance by using a thixotropic adhesive. Lateral expansion of the shims 42 can also be limited by choosing an adhesive sufficiently viscous (so that it does not move far) and/or by choosing the adhesive which cannot wet the surfaces 12 and 21 at specified positions marked by a coating material like e.g. a paint that the adhesive cannot wet. The specified positions can be for instance a ring of paint around the region of the surface 12 where the adhesive should remain. An example of adhesive for the stud 4 is epoxy. Epoxy is a thermoset material which is fully crosslinked after curing. This makes that the material is mechanically more stable over time than other adhesive systems.

Epoxy is the binder material which is used to produce the prepreg layers out of which a PCB is composed. In essence the epoxy studs once installed and hardened are an extension of the PCB which makes a perfect fit with its counterpart.

Typical operating temperatures for the epoxy adhesive are 20° C. above ambient temperature (e.g. with ambient temperature in the interval=−30 to 50° C.).

The typical distance 2 between the second surface 12 and the first surface 21 is 0.1 mm to 0.6 mm.

Studs were successfully manufactured, for example, with 3M™ Scotch-Weld™ Epoxy Adhesive DP110.

An epoxy that is also UV curable may be more convenient for mass-production. If shrinkage is a problem (i.e. as can be the case when the distance between the first surface 21 and second surface 12 is small, Epoxy's with additional filler materials can be used to mitigate shrinkage.

In some embodiments of the invention, the pillar 41 can be absent. This can be the case when the adhesive is injected with a needle extending until the first surface 21 of the carrier board 2. This can also be the case if just enough material is dispensed and only traces of the adhesive remain on the sidewalls of the opening 3.

The pillar 41 can nevertheless offer advantages. First, it will increase the contact area with the carrier board which can be advantageous (as adhesion will increase with the area of the surface being contacted by the glue). The pillar can also help to distribute the force during the peeling action of the glue when a module is replaced. The pillar also simplifies the process with which the adhesive is dispensed. Indeed, if only the shim 42 were deemed useful, the pillar can be considered to be formed by an excess of dispensed adhesive or glue. The amount of adhesive or glue that is needed is a function of the spacing between LED board and the carrier board, which is different for every connection point. Since there is a buffer (i.e. as provided by the pillar 42) the amount of dispensed adhesive or glue is also less critical (i.e. if more glue is dispensed than necessary to form the shims 42, it will simply fill the opening 3 and form the pillar section 43 of the stud 4). The thickness of the shim 42 of the stud 4 between the LED board 1 and the carrier board 2 will automatically match the distance "e" between the LED board and the carrier board without requiring adjustment or supervision.

When several adjacent LED boards need to be stitched together and fastened to the same carrier board 2, it is preferred that the tops or tips of the LEDs 5 of adjacent LED boards be in the same plane whereby the LEDs on the same tile should be substantially in the same plane. This can be achieved by using an offset frame and a reference plate as will now be described. In other embodiments of the invention, it is not the top of the LEDs but the layer from where the LED light is re-directed that should be in the same plane: that layer can comprise optical element e.g. be a light scattering layer or a layer of microlenses.

Figure 3:
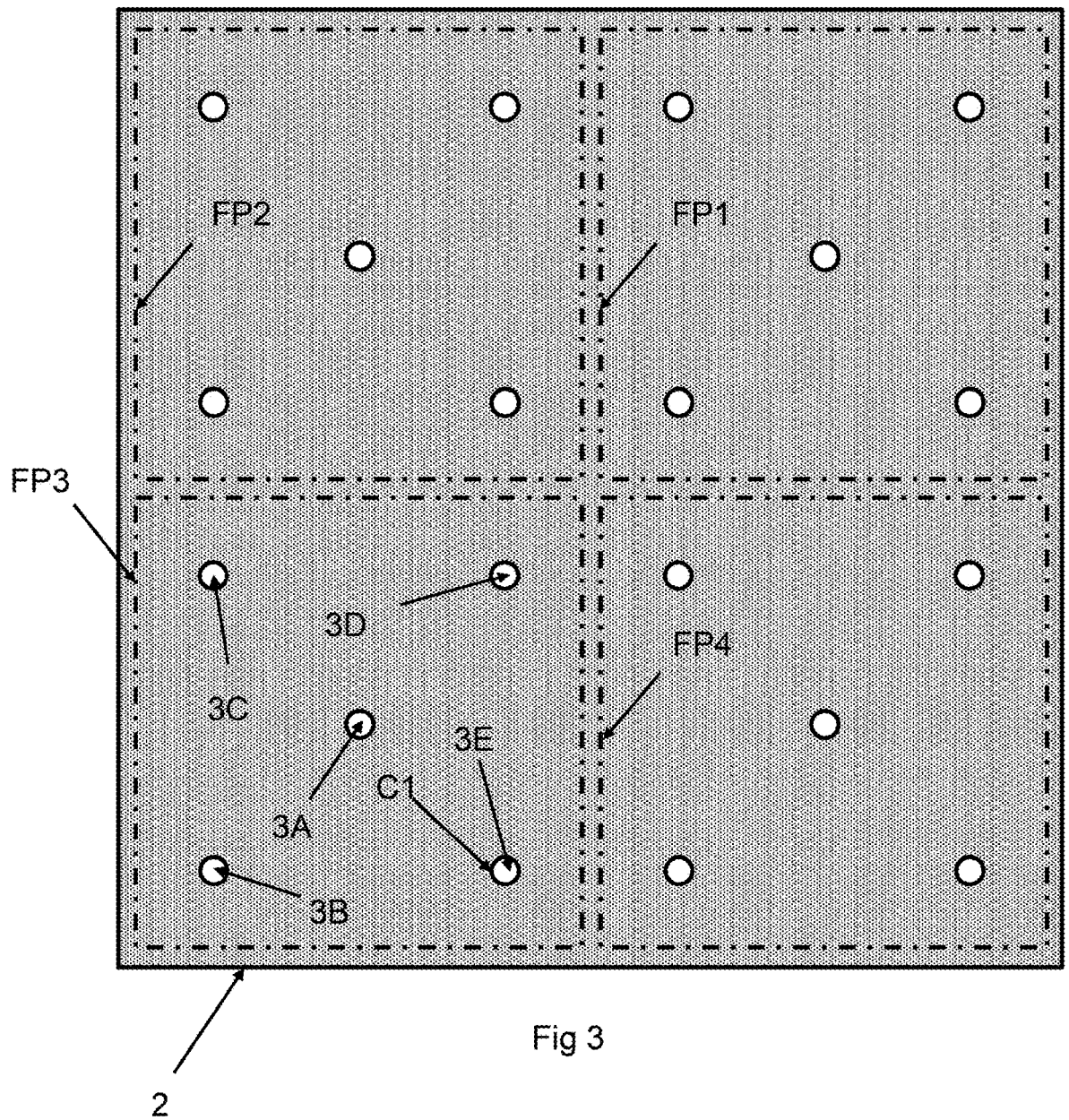
FIG. 3 shows a top view of an example of carrier board according to an embodiment of the present invention.

FIG. 3 shows a top view of a carrier board 2 to which a number N of LED boards will be fastened. As an example, an embodiment will be described with N=4.

The carrier board 2 has at least one opening, like opening 3A, per LED board. In the example of FIG. 3, there are 5 openings (3A, 3B, 3C, 3D, 3E) for each nominal position of a LED board. The nominal position of a LED board is represented by a footprint FP (FP1, FP2, FP3 and FP4). The openings 3 do not line up with seams between the LED tiles.

Figure 4:
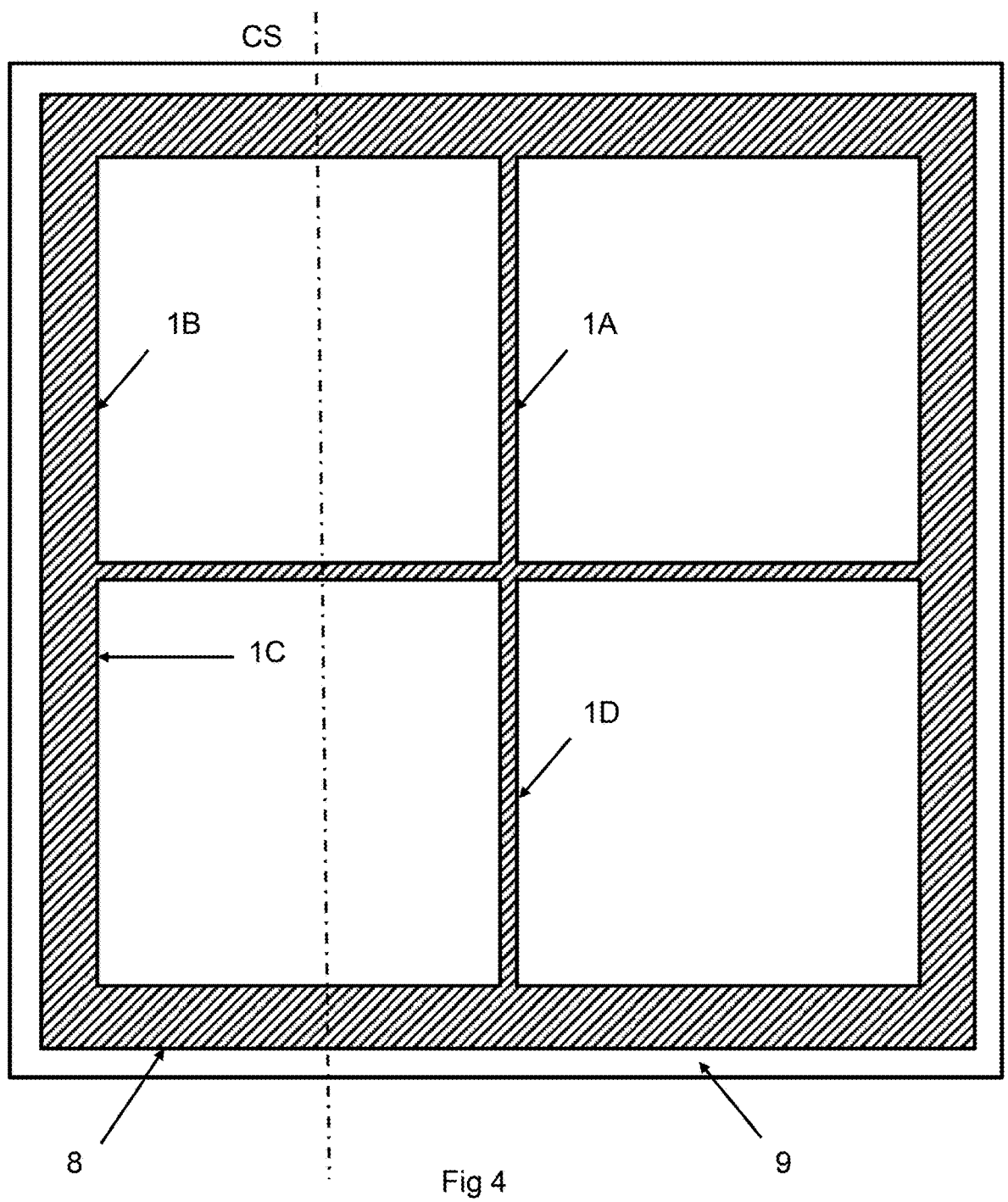
FIG. 4 shows a top view of a reference board with LED boards and offset frame.
Figure 6:
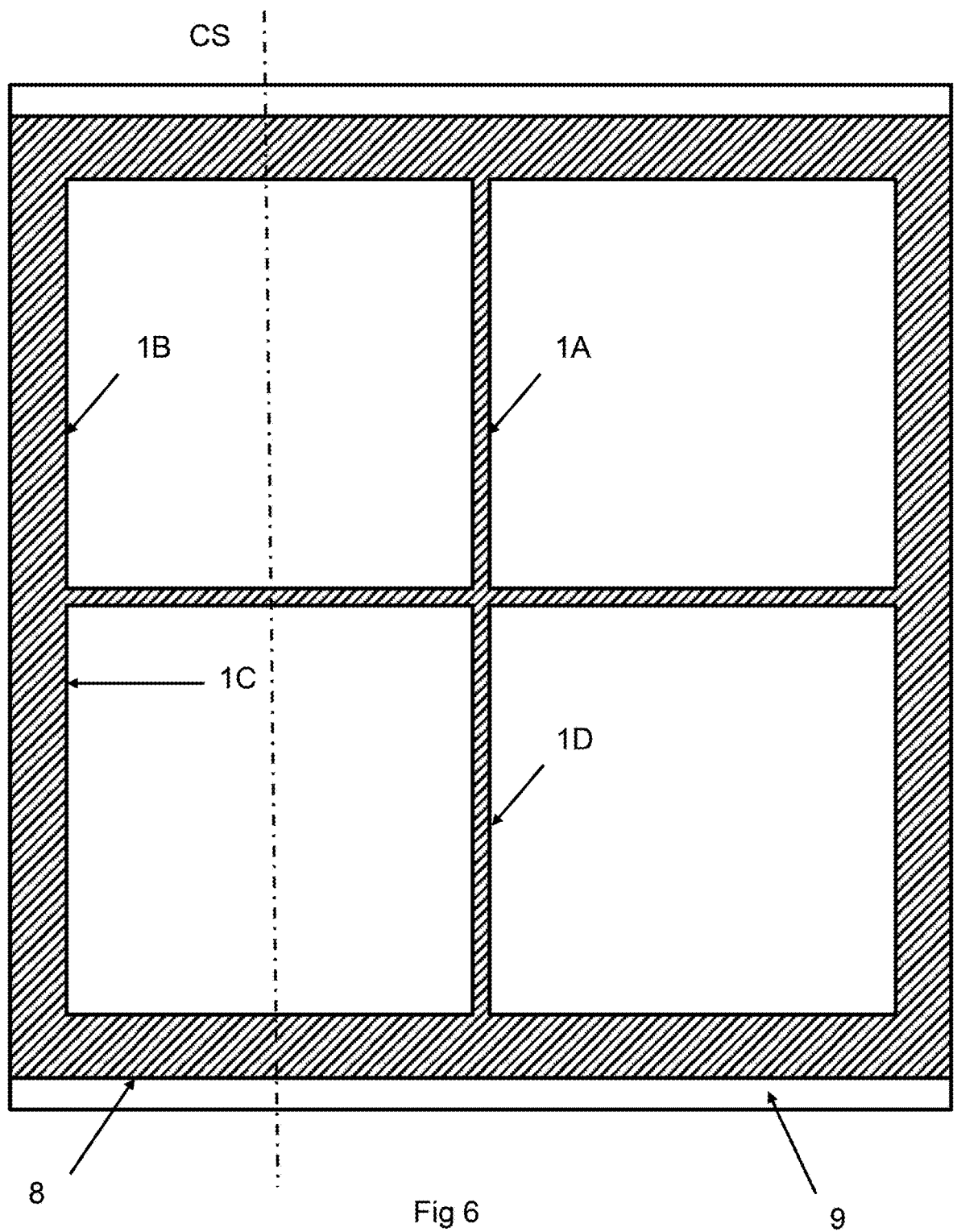
FIG. 6 shows a top view of a reference frame with LED boards and an alternative offset frame.

The LED tiles (1A, 1B, 1C and 1D) are positioned next to each other on a first reference plate 8 as illustrated on the top view on FIG. 4 and the cross section (along the direction CS) on FIG. 5. The LED tiles have their light sources 5 such as LEDs or OLEDs' facing the reference plate 8 and touching it. An offset frame 9 surrounds the LED tiles. The offset frame can be "all around" as on FIG. 4 or it can consist of two or more components as illustrated on FIG. 6.

Figure 7:
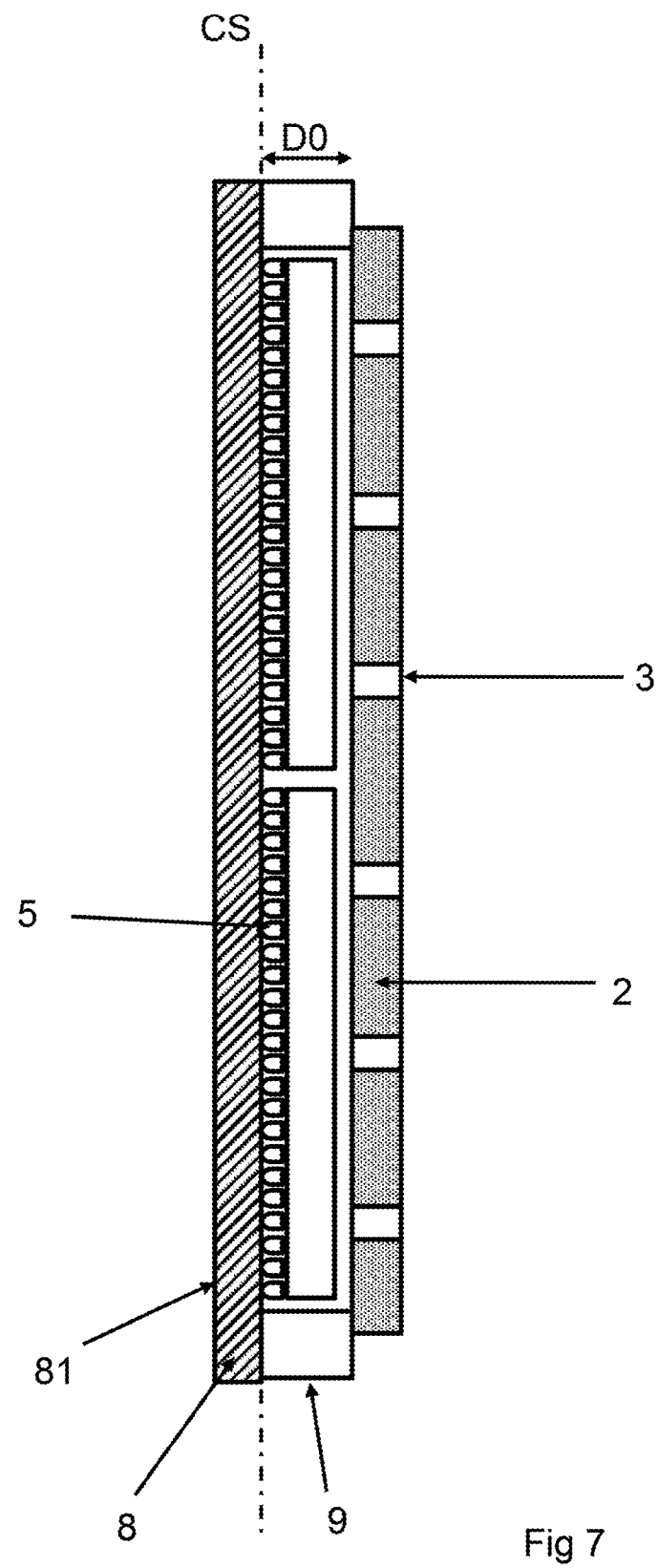
FIG. 7 is a cross section showing how the offset frame determines the distance between the top of LED elements and a first surface of a carrier board.

The carrier board 2 is then positioned above the LED board 1. In the example of FIG. 7, the offset frame 9 determines the distance D0 between the first surface 21 of the carrier board and the plane containing the top of the LED (like e.g. LED board 1B and 1C) or a layer above the tops of the LEDs.

Figure 8:
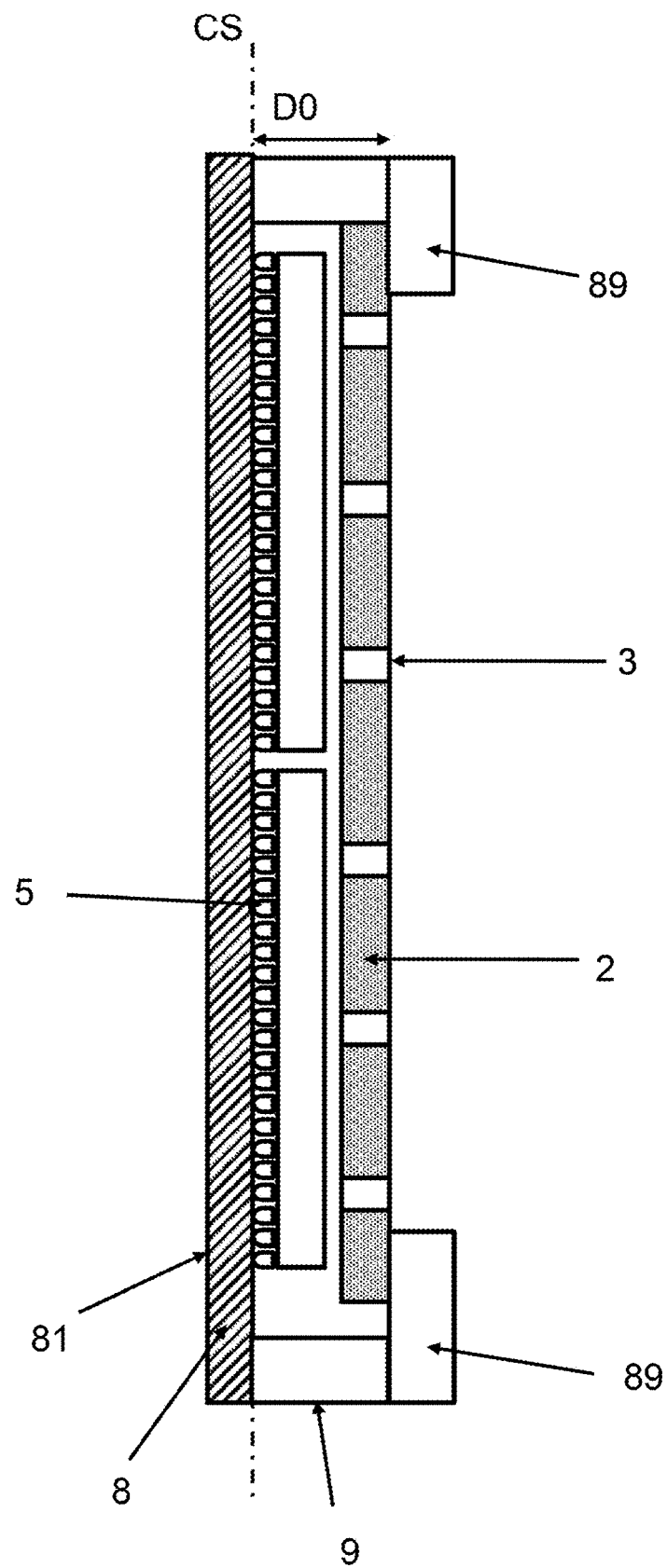
FIG. 8 is a cross section showing how the offset frame determines the distance between the top of LED elements and a second surface of a carrier board.

In the example of FIG. 8, the offset plate 9 determines the distance D0 between the second surface 22 of the carrier board and the plane containing the top of the LED (like e.g. LED board 1B and 1C). An additional frame element 89 can be used in contact with surface 81 of the reference plate 8 to keep the carrier board 2 in place.

Figure 9:
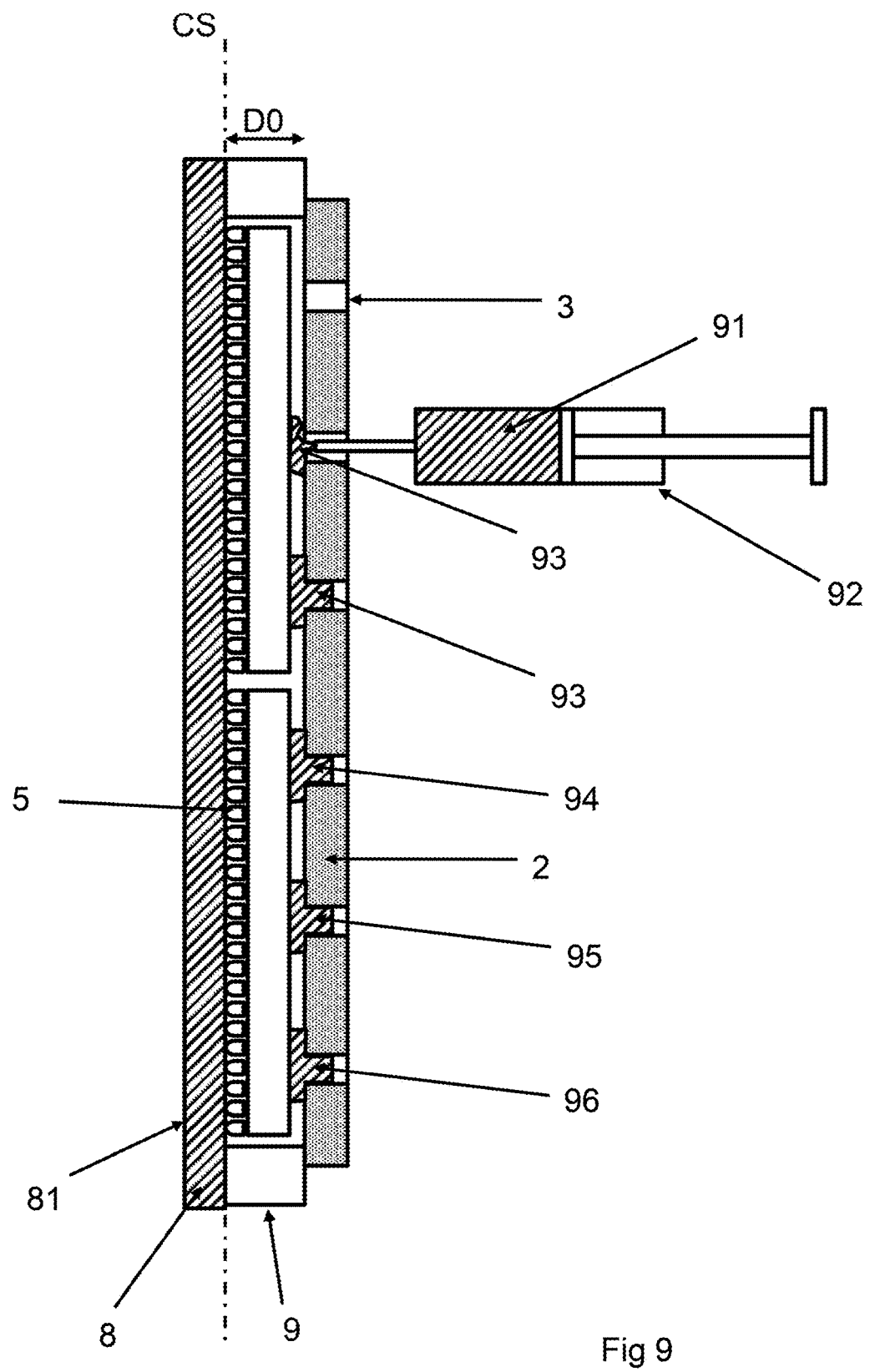
FIG. 9 is a cross section showing how an adhesive is dispensed between a LED board and the carrier board to which it is fastened.

An adhesive 90 is then applied on discreet spots by dispensing or injecting through the holes 3 in the carrier board 2. When these spots solidify or are hardened e.g. by curing, the adhesive 90 forms an adhesive "stud" (93, 94, 95). This is illustrated on FIG. 9. The adhesive 90 can be dispensed e.g. by any appropriate means. On FIG. 9, the dispenser device is represented by a syringe 92 and its needle.

A bolus 93 of adhesive 90 is injected or dispensed through one of the holes 3 in the carrier board 2. When the adhesive 90 cures, there can be shrinkage. Therefore all the components are held in place during the curing. For example, the carrier board (2) the reference plate (8), the offset frame (9) and the display boards are held in place during solidification or curing of the adhesive. This prevents the parts from moving or deforming due to the shrinkage of the adhesive 90. The top surface and sides of the adhesive studs (93, 94, 95) are open, which allows the adhesive 93 to sink in and relieve the stress.

Figure 10A:
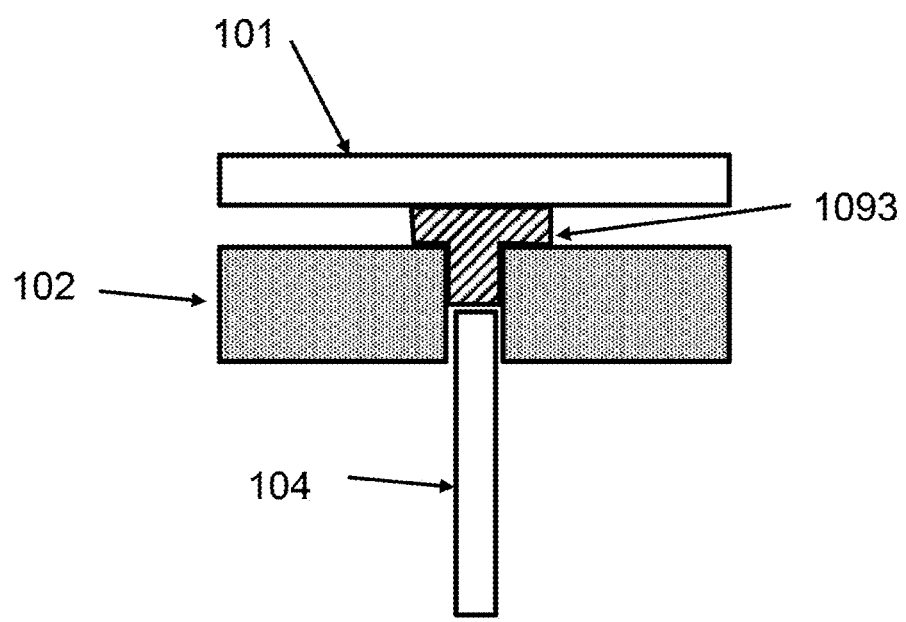
FIGS. 10A, 10B and 10C show how a LED board and carrier board assembled according to an embodiment of the present invention can be disassembled for e.g. maintenance.

The adhesive 93 in its final position being accessible at all times, makes it possible to service or replace a LED board 1. This can be done by simply pushing on the backside of the adhesive studs. This is illustrated on FIGS. 10A, 10B and 10C. FIG. 10A shows a close-up of an adhesive stud 1093 adhering to a carrier board 102 and a LED board 101. A tool 104 is introduced in the hole 103 that was used to inject the adhesive that forms the stud 1093.

Using adhesive to space and fix the carrier board to the display boards means that the adhesive in combination with the use of an offset plate can absorb varying thicknesses of the display boards. Despite such variation, the offset plate sets a distance relevant to the differences in the out of plane Z direction between display boards. This difference in the Z direction can be held to below 3% of the pixel pitch in embodiments of the present invention, e.g. less than 24 micron for display boards such as OLED or LED boards with a pixel pitch of 24 micron.

Figure 10B:
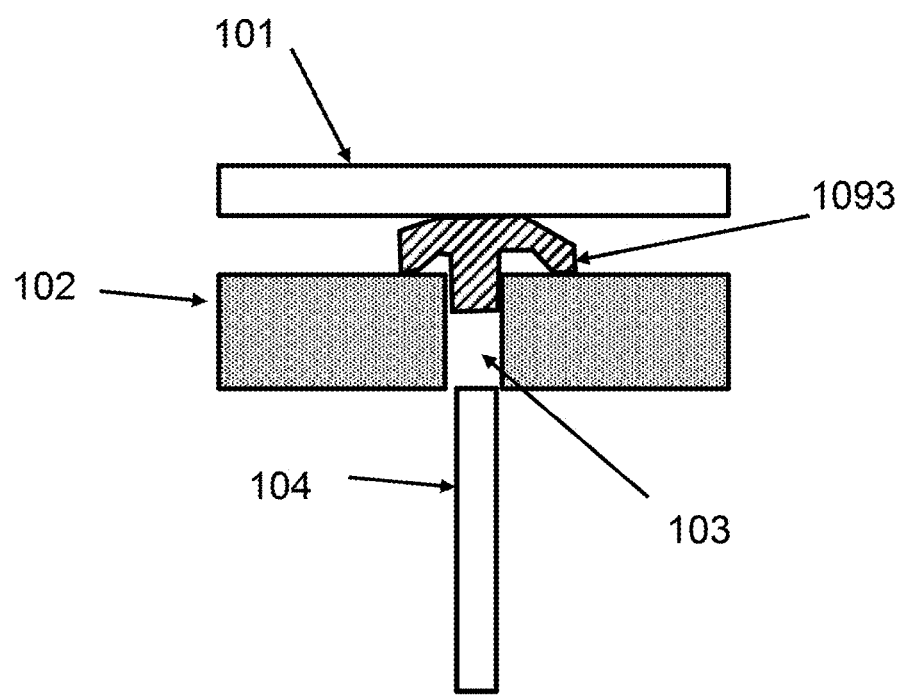

FIG. 10B illustrates how a simple tool like e.g. a screw-driver 104 can be used to apply a force on the adhesive stud 1093. The stud 1093 is seen as it peels off cleanly from the carrier board 102.

Figure 10C:
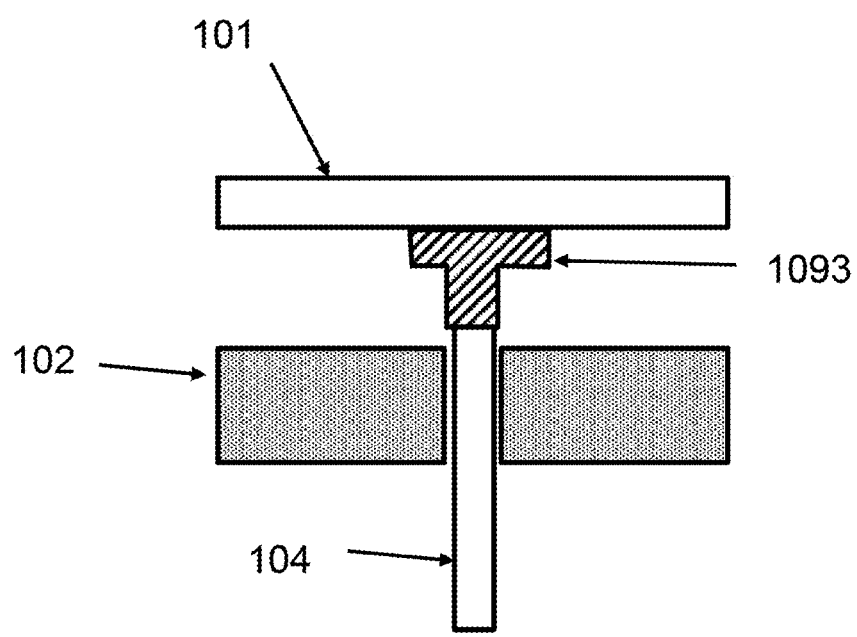

FIG. 10C shows the result of having applied sufficient force on the adhesive stud 1093: the stud now adheres only to the LED board 101 and not to the carrier board 102 anymore.

Figure 13:
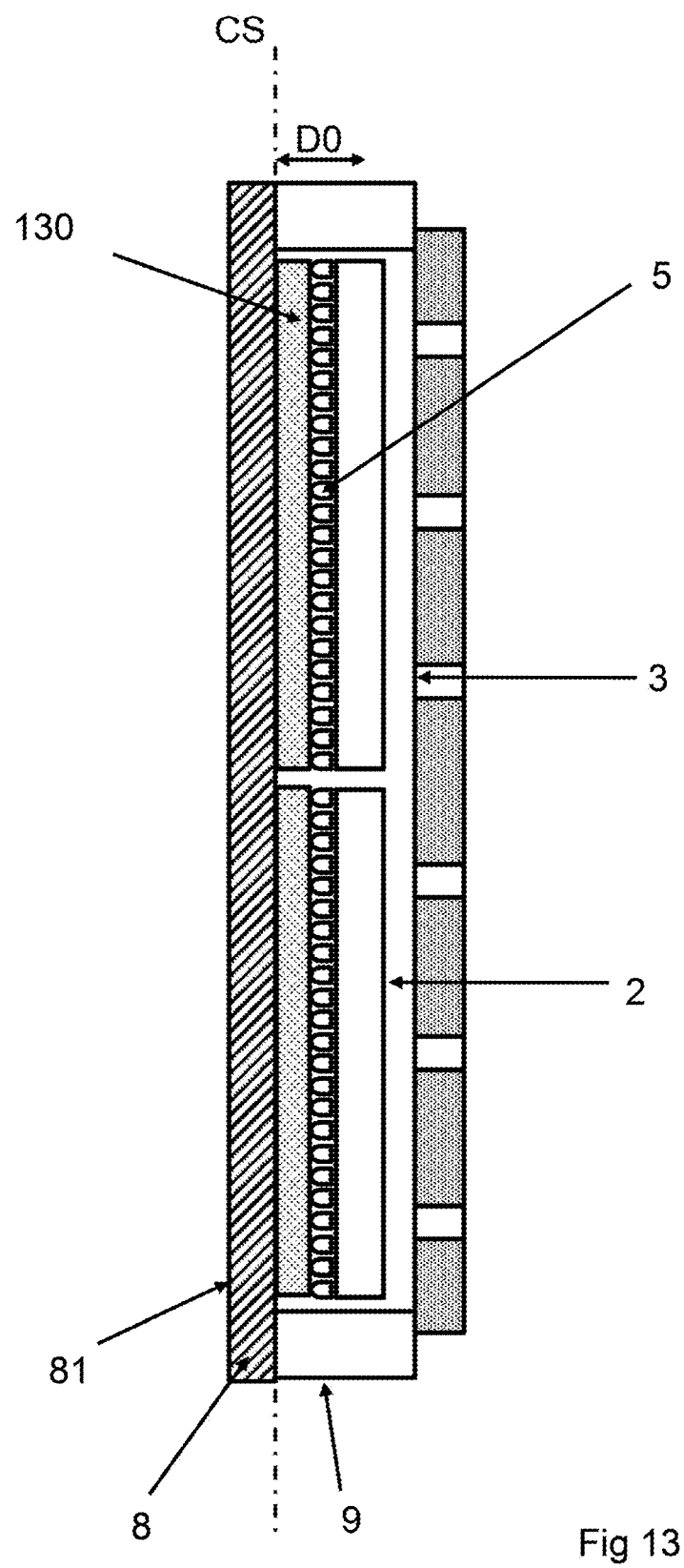
FIG. 13 shows an example where the LED are covered with a diffuser and/or a microlenses network according to an embodiment of the present invention.

As indicated above, in some embodiments of the invention, it is not the top of the LEDs but the top of a layer from where the LED light is re-directed that should be in the same plane. That layer can be e.g. a light scattering layer, a layer of micro-lenses, a polarizing layer or a combination of two or more of such layers. In that case, it is the top of a layer 130 that is used for the alignment as illustrated in FIG. 13. Layer 130 can be a clear plate such as a glass plate or a plate with an optical function such e.g. a light scattering layer, a layer of micro-lenses, a polarizing layer or a combination of two or more of such layers.

These layers can be used to hide any differences between display boards in the "Z" direction, i.e. the direction out of the plane of the display.

Figure 14:
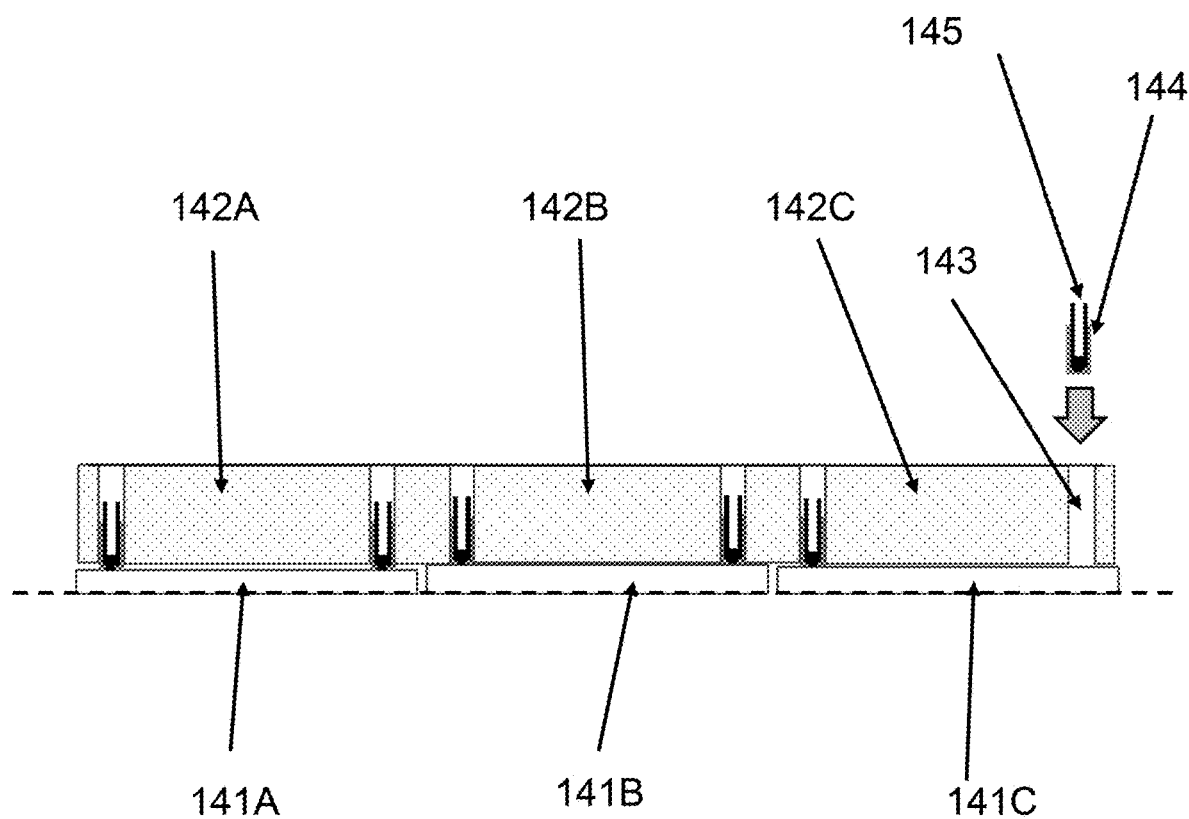
FIGS. 14 and 15 show a stud of an alternative embodiment of the present invention.
Figure 15:
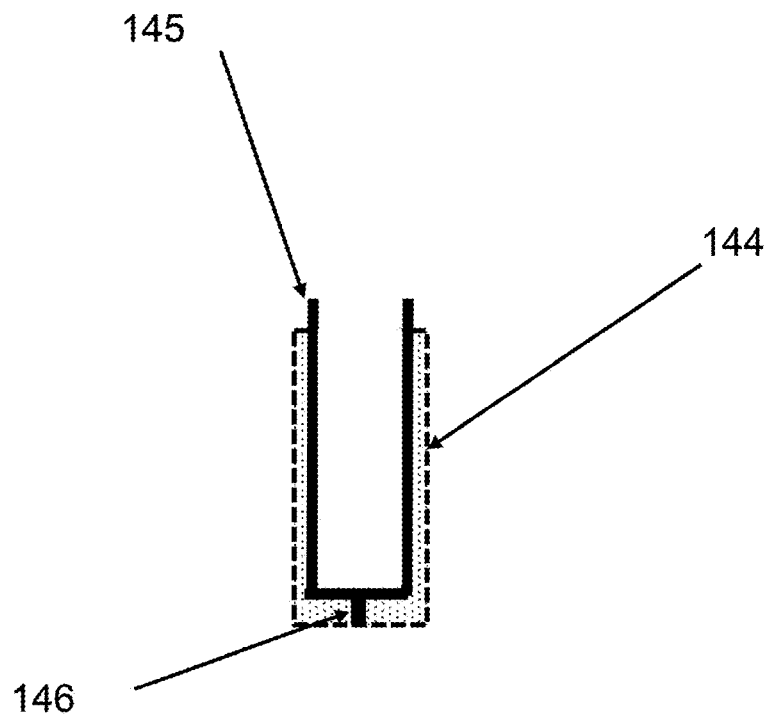

FIGS. 14 and 15 show an alternative embodiment for the stud. A cylinder 145 is coated with glue 144 and inserted in an opening 143 in the backbone or carrier board 142. The cylinder is pushed into the opening until it reaches the display board 141C. After the glue has solidified hardened or has been cured, the display board is fastened to the carrier board.

FIG. 15 shows an example of cylinder 145. The cylinder 145 can be hollow (e.g. for insertion of a tool when a LED board must be disassembled according to what is illustrated on FIGS. 10A, B and C). The cylinder 145 can be tapered at the end closest to the LED board 141C: a tip 146 can determine the minimum distance between the rest of the cylinder 145 and the LED board 141 thereby allowing to control the thickness of the layer of glue that will fasten the LED board to the carrier board.

Figure 16:
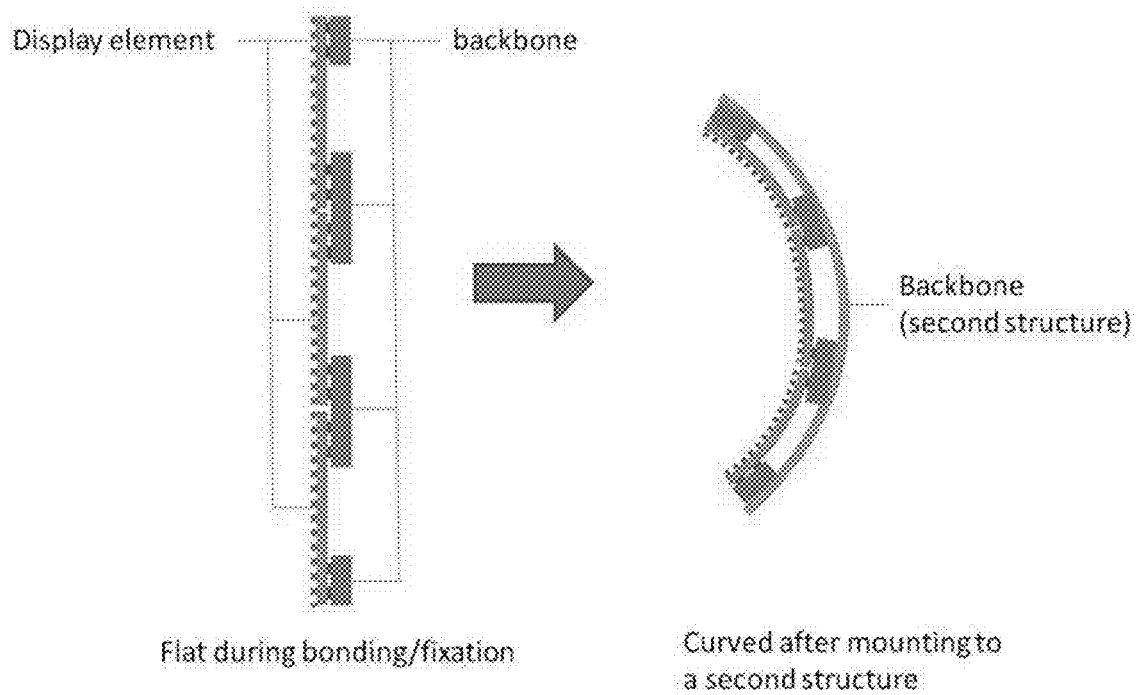
FIG. 16 shows a method of forming a curved display according to an embodiment of the present invention.

Embodiments of the present invention apply to flat or curved displays (see FIG. 16). The process as described above can be used identically for both flat and curved displays. Referring to FIG. 16, a curved display can be produced by a method according to embodiments of the present invention. The display can be semi-segmented, meaning that the transitions between display elements will be flat as they are partially supported at the edges of the display element. For curved displays according to embodiments of the present invention, the center part of the display elements are bent but only after the bonding of the elements themselves in a flat state. The backbone of a curved display comprises multiple strips (e.g. bonded to the display element) mounted onto a second structure which can be, but is not necessarily curved itself. Other shapes of display are included within the scope of the present invention as can be constructed from display elements which can be deformed or bent after the bonding of the elements themselves in a flat state and then fixed together. An advantage of embodiments of the present invention is that the process can be automated, e.g. using pick and place robots. The processes of embodiments of the present invention involve relatively simple translation horizontally or vertically and these processes can be provided with jigs (such as reference and plates) to control the operations.

Also using adhesive to space and fix the carrier board to the display boards and the use of reference and offset plates in embodiments of the present invention means that varying thicknesses of the display boards can be compensated. Despite such variation, the offset plate sets a distance relevant to the differences in the out of plane Z direction between display boards. This difference in the Z direction can be held to below 3% of the pixel pitch in embodiments of the present invention, e.g. less than 24 micron for display boards such as OLED or LED boards with a pixel pitch of 24 micron.

The invention claimed is:

1. A display tile comprising:
   a display board and a carrier board,
   the display board and the carrier board being fastened together by an intermediary of a spacer, wherein the spacer is at least located between the carrier board and the display board on either side of an opening in the carrier board, the spacer being configured to set a relative position of the display board with respect to the carrier board,
   the spacer being a solidified adhesive,
   wherein the display board includes image forming elements and the spacer being configured to set a relative position of tops of the image forming elements with respect to the carrier board, the spacer extending across and filling a cross-section of the opening and engaging in the opening in the carrier board.

2. The display tile according to claim 1, wherein the opening has sidewalls and the spacer comprises a pillar or bolt like section and occupies a part of the opening and is delimited laterally by the sidewalls of the opening.

3. The display tile according to claim 1, wherein the carrier board has a first major surface and a second major surface remote from the display board and one or more sidewalls of the opening in the carrier board is perpendicular to the second major surface of the carrier board.

4. The display tile according to claim 1, wherein the carrier board is adapted to be connected to a frame or bracket.

5. The display tile according to claim 1, wherein the adhesive sets the relative position of the display board with respect to the carrier board.

6. A display comprising display tiles according to claim 1.

7. The display according to claim 6, wherein the display is flat or curved.

8. The display tile according to claim 1, wherein the spacer consists essentially of the adhesive.

9. The display tile according to claim 1, wherein the solidified adhesive is a thixotropic adhesive or a cured adhesive.

10. A method of fixing a carrier board to one or more display boards having image forming elements, the carrier board having at least one opening per display board, the method comprising:
    positioning the one or more display boards next to each other on a first reference plate;
    placing an offset frame so that it surrounds the one or more display boards;
    positioning one or more carrier boards above the one or more display boards, the one or more carrier boards having a first major surface and a second major surface remote from the one or more display boards, wherein the offset frame determines a distance from the first major surface of the one or more carrier boards and a plane containing tops of the image forming elements, or the offset frame determines a distance (D0) between the second major surface of the one or more carrier boards and the plane containing the tops of the image forming elements,
    applying an adhesive on discreet spots through one or more openings in the one or more carrier boards to locate the adhesive between the one or more carrier boards and the one or more display boards on either side of the one or more openings in the one or more carrier boards, the adhesive being applied to extend through and to fill a cross-section of the one or more openings to form a spacer, wherein the spacer fastens the one or more display boards and the carrier boards together by an intermediary of the spacer, wherein the spacer is located at least on either side of the one or more openings between the one or more carrier boards and the one or more display boards, and
    allowing the adhesive to solidify to form the solidified spacer to set a relative position of the tops of the image forming elements with respect to the one or more carrier boards and to set a relative position of the one or more display boards with respect to the one or more carrier boards.

11. The method according to claim 10, wherein the adhesive is applied in a bolus of adhesive injected or dispensed through the one or more openings in the carrier board.

12. The method according to claim 10, wherein the one or more display boards, the carrier board, the first reference plate, the display board or boards and the offset frame are held in place during solidification of the adhesive.

13. The method according to claim 12, wherein the one or more openings have sidewalls and the solidifying of the adhesive comprises forming a pillar or bolt like section that occupies a part of the one or more openings and is delimited laterally by the sidewalls of the one or more openings.

14. The method according to claim 11, wherein the carrier board has a first major surface and a second major surface remote from the display board and one or more sidewalls of the opening in the carrier board is perpendicular to the second major surface of the carrier board.

15. A tiled display apparatus comprising a plurality of display tiles according to claim 1 fixed to a frame.

16. A method to set a distance between tops of LEDs on a first surface of a LED board on a display tile and a back surface of a carrier board of the display tile, the method comprising the steps:
    positioning the tops of the LEDs on a LED board in a first reference plane,
    aligning openings in the carrier board with spacers distributed on the LED board,
    positioning a second surface of the carrier board in a second reference plane, a first surface of the carrier board facing a second surface of the LED board, the first and second reference planes being parallel and the distance between the first and second reference planes being equal to a nominal distance (D0), applying an adhesive in the openings in the carrier board to locate the adhesive between the carrier board and the display board on either side of the openings in the carrier board, wherein on one side, the adhesive, when solidified, sets a relative position of the tops of the LEDs with respect to the carrier board and extends through and fills cross-sections of the openings and forms a spacer, the spacer fastening the display board and the carrier board together by an intermediary of the spacer, and allowing the adhesive to solidify to form the spacer to set a relative position of tops of image forming elements relative to the carrier board and relative positions of the display board relative to the carrier board.

17. The method according to claim 16, wherein the adhesive is applied in a bolus of adhesive injected or dispensed through the one or more openings in the carrier board.

18. The method according to claim 17, wherein the opening has sidewalls and the adhesive when solidified comprises a pillar or bolt like section and occupies a part of the opening and is delimited laterally by the sidewalls of the opening.

* * * * *